US008064730B2

(12) United States Patent
Visser et al.

(10) Patent No.: US 8,064,730 B2
(45) Date of Patent: Nov. 22, 2011

(54) DEVICE MANUFACTURING METHOD, ORIENTATION DETERMINATION METHOD AND LITHOGRAPHIC APPARATUS

(75) Inventors: Raimond Visser, Best (NL); Leo Wilhelmus Maria Kuipers, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 1166 days.

(21) Appl. No.: 10/935,739

(22) Filed: Sep. 8, 2004

(65) Prior Publication Data
US 2005/0117794 A1   Jun. 2, 2005

(30) Foreign Application Priority Data
Sep. 22, 2003   (EP) .................................... 03077993

(51) Int. Cl.
*G06K 9/00*   (2006.01)
(52) U.S. Cl. ........ 382/294; 382/141; 345/649; 356/426; 378/34
(58) Field of Classification Search .................... 382/294
See application file for complete search history.

(56) References Cited

U.S. PATENT DOCUMENTS

| | | | | |
|---|---|---|---|---|
| 3,027,841 A * | 4/1962 | Dixson | .................. | 244/3.18 |
| 4,052,603 A * | 10/1977 | Karlson | .................. | 700/192 |
| 4,430,571 A * | 2/1984 | Smith et al. | .................. | 250/492.2 |
| 4,672,676 A * | 6/1987 | Linger | .................. | 382/141 |
| 5,229,872 A | 7/1993 | Mumola | | |
| 5,296,891 A * | 3/1994 | Vogt et al. | .................. | 355/67 |
| 5,329,130 A * | 7/1994 | Kai et al. | .................. | 250/492.22 |
| 5,497,007 A * | 3/1996 | Uritsky et al. | .................. | 250/491.1 |
| 5,523,193 A | 6/1996 | Nelson | | |
| 5,907,392 A * | 5/1999 | Makinouchi | .................. | 355/53 |
| 5,911,001 A * | 6/1999 | Kawada | .................. | 382/141 |
| 5,969,441 A * | 10/1999 | Loopstra et al. | .................. | 310/12.06 |
| 6,046,792 A | 4/2000 | Van Der Werf et al. | | |
| 6,087,673 A * | 7/2000 | Shishido et al. | .................. | 250/559.45 |
| 6,163,366 A * | 12/2000 | Okamoto et al. | .................. | 355/53 |
| 6,279,881 B1 * | 8/2001 | Nishi | .................. | 250/548 |
| 6,455,211 B1 * | 9/2002 | Yui et al. | .................. | 430/22 |
| 6,498,352 B1 * | 12/2002 | Nishi | .................. | 250/548 |
| 6,525,803 B2 * | 2/2003 | Kwan et al. | .................. | 355/53 |
| 6,544,805 B2 * | 4/2003 | Holcman et al. | .................. | 438/14 |
| 6,583,430 B1 * | 6/2003 | Muraki | .................. | 250/492.22 |
| 6,583,855 B2 * | 6/2003 | Krikke et al. | .................. | 355/67 |
| 6,640,002 B1 * | 10/2003 | Kawada | .................. | 382/141 |
| 6,648,730 B1 * | 11/2003 | Chokshi et al. | .................. | 451/6 |

(Continued)

FOREIGN PATENT DOCUMENTS

EP   1 098 360 A1   5/2001

(Continued)

*Primary Examiner* — John Lee
(74) *Attorney, Agent, or Firm* — Sterne, Kessler, Goldstein & Fox P.L.L.C.

(57) ABSTRACT

A method to determine a rotation of a substrate with respect to the patterning device without using a reference mark on the substrate is presented. At least two structures having corresponding features and present on the substrate, e.g. previously projected patterns, are imaged with a known position with respect to a measurement coordinate system. A distance vector between the at least two structures is determined. From the distance vector, a rotation angle is calculated. In an embodiment of the invention, there is provided a method to estimate a position of the substrate from the acquired image (s). A position is measured and used as a reference position for subsequent substrates of which the rotation angle is to be determined.

16 Claims, 4 Drawing Sheets

U.S. PATENT DOCUMENTS

| | | | |
|---|---|---|---|
| 6,774,374 B1 * | 8/2004 | Driessen et al. | 250/492.2 |
| 6,788,393 B2 * | 9/2004 | Inoue | 355/72 |
| 7,026,629 B2 * | 4/2006 | Bakker et al. | 250/423 P |
| 7,095,035 B2 * | 8/2006 | Nishimura | 250/492.22 |
| 7,783,443 B2 * | 8/2010 | Aratani et al. | 702/94 |
| 2001/0016293 A1 * | 8/2001 | Nishi et al. | 430/22 |
| 2001/0024278 A1 * | 9/2001 | Yoshida | 356/401 |
| 2002/0036762 A1 * | 3/2002 | Nishi | 355/53 |
| 2002/0054704 A1 * | 5/2002 | Smilansky et al. | 382/149 |
| 2003/0025891 A1 * | 2/2003 | Hoogenraad et al. | 355/53 |
| 2003/0211297 A1 * | 11/2003 | Rossing et al. | 428/195.1 |
| 2004/0033426 A1 * | 2/2004 | Den Boef et al. | 430/22 |
| 2004/0071332 A1 * | 4/2004 | Bruce et al. | 382/133 |

FOREIGN PATENT DOCUMENTS

| | | |
|---|---|---|
| JP | 57-80724 | 5/1982 |
| WO | WO 98/33096 A1 | 7/1998 |
| WO | WO 98/38597 A2 | 9/1998 |
| WO | WO 98/38597 A3 | 9/1998 |
| WO | WO 98/40791 A1 | 9/1998 |

* cited by examiner

DEVICE MANUFACTURING METHOD, ORIENTATION DETERMINATION METHOD AND LITHOGRAPHIC APPARATUS

PRIORITY INFORMATION

This application claims priority from European Patent Application No. 03077993.8, filed Sep. 22, 2003, the content of which is herein incorporated by reference in its entirety.

BACKGROUND

1. Field of the Invention

The present invention relates to lithographic apparatus and methods.

2. Description of the Related Art

Lithographic projection apparatus can be used, for example, in the manufacture of integrated circuits (ICs). In such a case, the patterning device may generate a circuit pattern corresponding to an individual layer of the IC, and this pattern can be imaged onto a target portion (e.g. including one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machines. In one type of lithographic projection apparatus, each target portion is irradiated by exposing the entire mask pattern onto the target portion at once; such an apparatus is commonly referred to as a wafer stepper or step-and-repeat apparatus. In an alternative apparatus—commonly referred to as a step-and-scan apparatus—each target portion is irradiated by scanning the mask pattern under the projection beam in a given reference direction (the "scanning" direction) while synchronously scanning the substrate table parallel or anti-parallel to this direction; since, in general, the projection system will have a magnification factor M (generally <1), the speed V at which the substrate table is scanned will be a factor M times that at which the mask table is scanned. More information with regard to lithographic apparatus as here described can be gleaned, for example, from U.S. Pat. No. 6,046,792, incorporated herein by reference.

In a device manufacturing process using a lithographic projection apparatus, a pattern (e.g. in a mask) is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4, incorporated herein by reference.

The term "patterning device" as here employed should be broadly interpreted as referring to a device that can be used to endow an incoming radiation beam with a patterned cross-section, corresponding to a pattern that is to be created in a target portion of the substrate; the term "light valve" can also be used in this context. Generally, the pattern will correspond to a particular functional layer in a device being created in the target portion, such as an integrated circuit or other device (see below). Examples of such patterning devices include:

A mask. The concept of a mask is well known in lithography, and it includes mask types such as binary, alternating phase-translation, and attenuated phase-translation, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired;

A programmable mirror array. One example of such a device is a matrix-addressable surface having a viscoelastic control layer and a reflective surface. The basic principle behind such a device is that, for example, addressed areas of the reflective surface reflect incident light as diffracted light, whereas unaddressed areas reflect incident light as undiffracted light. Using an appropriate filter, the undiffracted light can be filtered out of the reflected beam, leaving only the diffracted light behind; in this manner, the beam becomes patterned according to the addressing pattern of the matrix-addressable surface. An alternative embodiment of a programmable mirror array employs a matrix arrangement of tiny mirrors, each of which can be individually tilted about an axis by applying a suitable localized electric field, or by employing piezoelectric actuation devices. Once again, the mirrors are matrix-addressable, such that addressed mirrors and unaddressed mirrors will reflect an incoming radiation beam in different directions; in this manner, the reflected beam is patterned according to the addressing pattern of the matrix-addressable mirrors. The required matrix-addressing can, for example, be performed using suitable electronic devices. In both of the situations described hereabove, the patterning device can include one or more programmable mirror arrays. More information on mirror arrays as here referred to can be gleaned, for example, from U.S. Pat. No. 5,296,891 and U.S. Pat. No. 5,523,193, and PCT patent applications WO 98/38597 and WO 98/33096, which are incorporated herein by reference. In the case of a programmable mirror array, said support structure may be embodied as a frame or table, for example, which may be fixed or movable as required; and A programmable liquid-crystal display (LCD) panel. An example of such a device is given in U.S. Pat. No. 5,229,872, which is incorporated herein by reference. As above, the support structure in this case may be embodied as a frame or table, for example, which may be fixed or movable as required.

For purposes of simplicity, the rest of this text may, at certain locations, specifically direct itself to examples involving a mask and mask table; however, the general principles discussed in such samples should be seen in the broader context of the patterning means as hereabove set forth.

For the sake of simplicity, the projection system may hereinafter be referred to as the "lens"; however, this term should be broadly interpreted as encompassing various types of projection system, including refractive optics, reflective optics, and catadioptric systems, for example, whereby any of these types of projection system may either be suitable for conventional imaging or be suitable for imaging in the presence of an immersion fluid. The radiation system may also include components operating according to any of these design types for directing, shaping, or controlling the projection beam of radiation, and such components may also be referred to below, collectively or singularly, as a "lens". Further, the lithographic apparatus may be of a type having two or more substrate tables (and/or two or more mask tables). In such "multiple stage" machines the additional tables may be used in parallel, or preparatory steps may be carried out on one or more tables while one or more other tables are being used for exposures. Dual stage lithographic apparatus are described, for example, in U.S. Pat. No. 5,969,441 and WO 98/40791, both incorporated herein by reference.

In the device manufacturing process, the projection of the pattern and the substrate onto which the pattern is projected should be accurately aligned. For example, when a second or further layer is to be projected on the substrate, the second or further layer should be aligned in accordance with the previously projected layer(s).

Because of the desirable accuracy, the alignment may be performed in two steps: a pre-alignment and an actual alignment. In the pre-alignment step, the substrate is roughly positioned, i.e. positioned with certain accuracy, but with less accuracy than eventually the desirable accuracy. At the position after pre-alignment, the alignment system may be able to track any alignment mark on the substrate and align the substrate according to the required accuracy. However, this method is slow when the accuracy of the pre-alignment is rough and the capture range, i.e. the field of view, of the alignment system is small. To speed up the alignment, the pre-alignment accuracy may be improved, the capture range may be enlarged, or both.

An important alignment direction of the substrate is its rotation. Accurate (pre-) alignment methods are known, for example from U.S. Pat. No. 6,544,805, but these methods use predefined marks on the object to be aligned. On the substrate, however, there is very little space for any marks.

SUMMARY

Embodiments of the invention include a device manufacturing method including: providing a substrate that is at least partially covered by a layer of radiation-sensitive material; providing a beam of radiation using a radiation system; using a patterning device to endow the beam of radiation with a pattern in its cross-section; determining an orientation of the substrate; aligning the substrate and the patterning device according to the orientation of the substrate; and projecting the patterned beam of radiation onto a target portion of the layer of radiation-sensitive material.

The above mentioned device manufacturing method may be employed using a lithographic projection apparatus including a radiation system configured to provide a beam of radiation; a support structure configured to support a patterning device, the patterning device serving to pattern the beam of radiation according to a desired pattern; a substrate table configured to hold a substrate; and a projection system configured to project the patterned beam of radiation onto a target portion of the substrate. Hereinafter, the lithographic apparatus will be described in more detail.

In an embodiment of the present invention, there is provided an accurate (pre-) alignment method configured to orient an object.

In a further embodiment of the present invention, there is provided an alignment method configured to orient an object that does not necessitate the use of any predefined mark.

A device manufacturing method according to an embodiment of the invention includes determining an orientation of the substrate, wherein determining the orientation of the substrate includes determining a rotation of the substrate by: determining a distance vector in a measurement coordinate system between at least two structures having corresponding features and of which relative positions are known in relation to a pattern coordinate system; decomposing the distance vector into a first distance along a first axis of the measurement coordinate system and a second distance along a second axis of the measurement coordinate system; and calculating a rotation of the pattern coordinate system in relation to the measurement coordinate system using the first and the second distance.

In a device manufacturing method using a rotation determination method according to an embodiment of the present invention, any structure on the substrate may be used to determine a rotation of a pattern present on the substrate. The structure may be a part of a previously projected pattern, e.g. a target portion, or it may be any other structure, possibly purposefully present for determining the rotation.

A substrate onto which a pattern is to be projected may have a certain orientation, i.e. a position and a rotation, that is known to a lithographic apparatus with certain accuracy, but the orientation may need to be determined with a higher accuracy before projecting a pattern thereon. Thus, it is desirable that the lithographic apparatus determine a rotation and a position of the substrate.

If there is no previously projected pattern on the substrate, the rotation of the substrate may not have to be known with a high accuracy. However, if one or more layers with patterns are present on the substrate, the rotation should be determined with a high accuracy. To determine the rotation, the on the substrate present pattern may advantageously be used. Conventionally, a substrate includes multiple target portions positioned in a recurrence grid. On each target portion, a pattern is projected. The recurrence grid is thereto known to the lithographic apparatus, so the lithographic apparatus may displace the substrate with respect to the projection beam. Having multiple target portions with the same pattern in a known recurrence grid enables to determine a rotation of the substrate, in particular of the grid on the substrate, using e.g. the target portions. Therefore, no predefined marks are required to determine the rotation.

The rotation of the substrate is relative to the lithographic apparatus, in particular to the projection beam. In an embodiment of the invention, there is provided a pattern coordinate system associated with the substrate and a measurement coordinate system associated with the lithographic apparatus. The relative rotation may thus be determined as a rotation of the pattern coordinate system with respect to the measurement coordinate system.

The pattern and measurement coordinate systems may be well-known Cartesian coordinate systems having orthogonal axes or may be any other coordinate system as long as the relative rotation may be determined as a rotation of the pattern coordinate system with respect to the measurement coordinate system.

In an embodiment of the invention, measurements are performed with at least two structures, e.g. target portions provided with a pattern, present on the substrate A position of these structures relative to each other is known in the pattern coordinate system. Although the structures do not need to be predefined marks—please note that they may be predefined marks—their known position relative to each other enables one to calculate a rotation. The rotation may be determined, in an embodiment of the invention, from the actual relative positions of the structures compared to relative positions of the structures in case the substrate has a certain known rotation, i.e. the rotation is determined from deviations of the relative positions of the structures from certain theoretical positions.

The actual relative positions of the structures may be indicated by a distance vector, in an embodiment of the invention. The distance vector indicates the distance and direction between the structures and is represented in the measurement coordinate system. Thus, the relative positions of the structures are determined as a distance vector in the measurement coordinate system.

To derive the distance vector, the structures may have corresponding features. The corresponding features enable comparison of the structures and may define a reference position of the structures. This reference position may be a position of a corresponding feature or may be a center of gravity between multiple corresponding features, for example, or any other predefined reference position. A vector between the indicated reference positions of the structures may be the distance vector. Also other methods to obtain a distance vector between the structures may be employed.

The structures may lie on an axis of the pattern coordinate system, for example, or may lie on arbitrary positions in the pattern coordinate system. However, lying on an axis or on any straight line parallel to an axis may simplify the calculation of the rotation.

The distance vector may be decomposed along axes of the measurement coordinate system into a first and a second distance. From these two distances, the rotation may be calculated. Using goniometry, a rotation angle from these distances may be calculated. For example, if Cartesian coordinate systems are used and if the relative positions of the structures lie parallel to an axis of the pattern coordinate system, the rotation is equal to the inverse tangent of the ratio of the two distances. However, in any case wherein the positions of the two samples of the structure are known relative to each other in the pattern coordinate system, the rotation angle may be calculated using well-known goniometry.

The structures may have an arbitrary geometry and corresponding features, in an embodiment of the invention. The pattern projected onto a target portion may not be known to the lithographic apparatus in contrast to the recurrence grid. So, if the patterns provided on the substrate are used as the structures to determine the rotation with respect to the measurement coordinate system, the patterns may be unknown to the lithographic apparatus and therefore have an arbitrary geometry, i.e. they may have any geometry as long as they have corresponding features. However, as stated-above, the recurrence grid is known. The relative positions of two target portions or patterns, and thus a distance vector there between, is therefore derivable from the recurrence grid.

In an embodiment of the invention, the distance vector is determined from at least one image of the at least two structures, the at least one image being acquired by an imaging device. To derive the distance vector between the structures, it is desirable to detect the corresponding features of the structures. In present lithographic apparatus, an imaging device may be present. With such an imaging device, such as a CCD-camera or the like, one image of the at least two structures may be obtained, or an image of each of the structures may be obtained. In case of one image of the structures, sub-images of each structure present in the image may be cut therefrom. Thus, an image of each of the structures may be obtained. In the images, the corresponding features may be detected or the images may be compared to determine a distance vector between the structures based on the position of the corresponding features.

In another embodiment of the invention, an image of each of the at least two structures may be acquired separately. An advantage of a method acquiring two separate images is the improved accuracy. A resolution of the imaging system, defining the size of the smallest details distinguishable in the acquired image, is higher when only a small part of the substrate is imaged. A higher resolution, showing smaller details, may improve the accuracy of a measurement of the distance vector between the two samples.

The images are acquired by a measurement system at positions known in relation to the measurement coordinate system. After acquiring a first image, the imaging device and the substrate may be moved relative to each other, i.e. translated, rotated or both. After moving the imaging device, the substrate or both, a second image may be acquired. Thereafter, more images may be acquired to obtain more images of structures having corresponding features, for example to improve the accuracy of the measurement results, e.g. a rotation angle. The distance between the imaging positions is known. A distance vector between the structures relative to the imaging positions is derived from the comparison of the at least two images. A vector sum of the distance between the imaging positions and the distance vector relative to the imaging positions provides the distance vector between the at least two structures.

Since two structures on the substrate are to be compared, these structures should lie within the field-of-view of the imaging device. Therefore, the rotation that may be determined by the method according to an embodiment of the present invention may be limited by the size of the field-of-view, the number of corresponding features needed for comparison, and possibly other properties. As the limitation is associated with properties of specific embodiments, such as the type of imaging device, the size of the corresponding features used, the pitch of the recurrence grid, and the like, the limitation will not be described in further detail.

Comparing two images to obtain a distance vector may be performed using conventional techniques. Two images may be translated in relation to each other over a number of distances and in a number of directions. Then, the overlapping parts of the two images are subtracted for each translation. A difference value of the overlapping parts of the images may be minimized. Also, other well-known, more sophisticated methods such as correlation techniques exist. Such techniques find a maximum correlation between images. Please note that correlation is a broad term and should be interpreted as such. For example, a correlation is found using a correlation function. A broad variety of such correlation functions exists. In the rotation determination and alignment method according to an embodiment of the present invention, any comparing method suitable for determining a distance between structures may be employed.

In an embodiment of the present invention, the substrate may be rotated and the imaging device may be displaced essentially along a radius of the substrate to obtain a separate image of each structure. In an existing lithographic apparatus, the substrate is positioned on a rotatable pad and the imaging device is mounted such that it may move in a radial direction with respect to the rotation of the pad. With such an assembly, i.e. a rotatable substrate and an imaging device moveable along a radius of the rotation circle, every part of the substrate may be imaged. Using this assembly to image each structures separately, the present invention may be employed without additional hardware.

In the rotation determination and alignment method according to an embodiment of the present invention, the pattern coordinate system may be defined by a recurrence grid of a recurrent pattern. In a lithographic apparatus, a projected pattern usually includes multiple target portions. The target portions may be rectangular and placed in a rectangular, i.e. orthogonal, recurrence grid. The recurrence grid thus defines two orthogonal axes. These two orthogonal axes define a coordinate system that may advantageously be employed as a pattern coordinate system. A second or further projection on a second or further layer on the substrate, needed for the manufacturing of IC's should have substantially the same orientation as previous projections. As the recurrence grid is identical for each projection, the pattern coordinate system defined by the recurrence grid is identical for each projection and therefore unambiguous.

Symmetry in the structures may lead to erroneous results, especially when using a recurrent pattern. Therefore, the at least two structures may be asymmetrical. In a recurrent pattern, the at least two structures may be two from a multiplicity of structures having corresponding features. When comparing two images, the system may compare one or more other structures than the structures the system intended to compare, leading to erroneous results. Using asymmetrical structures or structures with asymmetrical positioned corresponding features, the possibility of finding and comparing corresponding features of a non-intended structure is negligible.

In case of a projection in a lithographic apparatus, a space between separate target portions, i.e. gridlines or scribe lines, may be imaged as a part of the structure. Although the geometry of the structures may be unknown to the lithographic apparatus, the position of the structures is known in relation to the recurrence grid. An imaging position may be selected such that it is expected to include a scribe line in the image. The image of a target portion and a scribe line may be interpreted as an asymmetrical structure, in particular when the image is smaller than the recurrent pattern, i.e. a target portion.

Not only the rotation of the substrate may be desirable, also an offset, i.e. a translation, of the pattern coordinate system in relation to a measurement coordinate system may be desirable. Therefore, in a further embodiment of the present invention, a translation of the pattern coordinate system in relation to the measurement coordinate system may be determined in the determination of an orientation of another substrate, comprising: determining a position of a first substrate using a position measurement system; determining a rotation of the other substrate using the same structures having corresponding features as used for determining the rotation of the first substrate; determining relative structure translation vectors between the at least two structures of the first substrate and of the other substrate; and determining a position of the other substrate using the measured position of the first substrate as a reference position and the structure translation vectors between the structures of the first substrate and of the other substrate as a displacement from the reference position.

Aligning a substrate and a patterning device may require not only the same rotation, but also the same position of the pattern on the substrate and the pattern of the patterning device. Therefore, it is an advantage to be able to use the same determination method for both rotation and position. However, in the above-described rotation determination method, the position of the at least two structures is only known relative to each other and in relation to the pattern coordinate system. Therefore, it may not be possible to determine a position of the pattern coordinate system with respect to the measurement coordinate system directly.

However, in practice, another measurement system, a position measurement system, determines the position of the substrate, and thus the pattern coordinate system, after determination of the rotation. Thus, when a second or other substrate on which the same pattern is to be projected and having the same structures thereon is supplied to the rotation measurement system, a position of the pattern of a first or at least previously measured substrate will be known after the position measurement by the position measurement system. This measured position of the first substrate may be used for subsequent substrates as a reference position.

The rotation determination method may use the same structures on each subsequent substrate within one batch with identical substrates. Therefore, the rotation measurement system may determine a translation of the structures of the subsequent substrate in relation to the structures of a previously measured substrate. Using the measured position of the previous substrate as a reference position, combining the translation of the subsequent substrate in relation to the reference position may provide an estimate of the position of the subsequent substrate in relation to the measurement coordinate system. As the position measurement takes relatively long in present lithographic apparatus, an estimate of the position may be used as a pre-measurement and may therefore result in a faster position measurement.

The position of a pattern on a substrate may be subject to variations because of variations originating from placing a first pattern on an empty substrate. Because of these position variations of the pattern on the substrate and other errors, e.g. resulting from measurement imprecision, the reference position may be subject to variations for each pattern and substrate. In an embodiment of the invention, the reference position is being updated after each determination of the position of each substrate by the position measurement system. The reference position is thus not determined from one measurement only, from the previous or the first substrate for example, but is updated after every position measurement by averaging, or using any other function, resulting in a reference position that is determined from multiple position measurements, increasing the accuracy of the estimation.

A method for aligning a substrate in a lithographic apparatus, according to an embodiment of the invention, includes acquiring images of a first and a second corresponding structure to determine a first distance vector between the first and the second corresponding structure in a measurement coordinate system of the lithographic apparatus, the first and second corresponding structure being located on two adjacent target portions of the substrate; determining a second distance vector between the first and second corresponding structure in a pattern coordinate system; and determining a rotation angle of the pattern coordinate system relative to the measurement coordinate system using the first and the second distance vector.

A person skilled in the art will readily appreciate that the orientation detection method according to the present invention may be employed in any case wherein an object includes multiple structures having corresponding features of which relative positions are known in relation to a pattern coordinate system.

In another embodiment of the present invention, there is provided a lithographic apparatus configured to perform the orientation detection method described in the above embodiments of the invention.

Although specific reference may be made in this text to the use of the method according to the invention in the manufacture of ICs, it should be explicitly understood that such a method has many other possible applications. For example, it may be employed in the manufacture of integrated optical systems, guidance and detection patterns for magnetic domain memories, LCD panels, thin-film magnetic heads, etc. The skilled artisan will appreciate that, in the context of such alternative applications, any use of the terms "reticle", "wafer", or "die" in this text should be considered as being replaced by the more general terms "mask", "substrate", or "target portion", respectively.

In the present document, the terms "radiation" and "beam" are used to encompass all types of electromagnetic radiation, including ultraviolet (UV) radiation (e.g. with a wavelength of 365, 248, 193, 157 or 126 nm) and extreme ultra-violet (EUV) radiation (e.g. having a wavelength in the range 5-20 nm), as well as particle beams, such as for example ion beams or electron beams.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
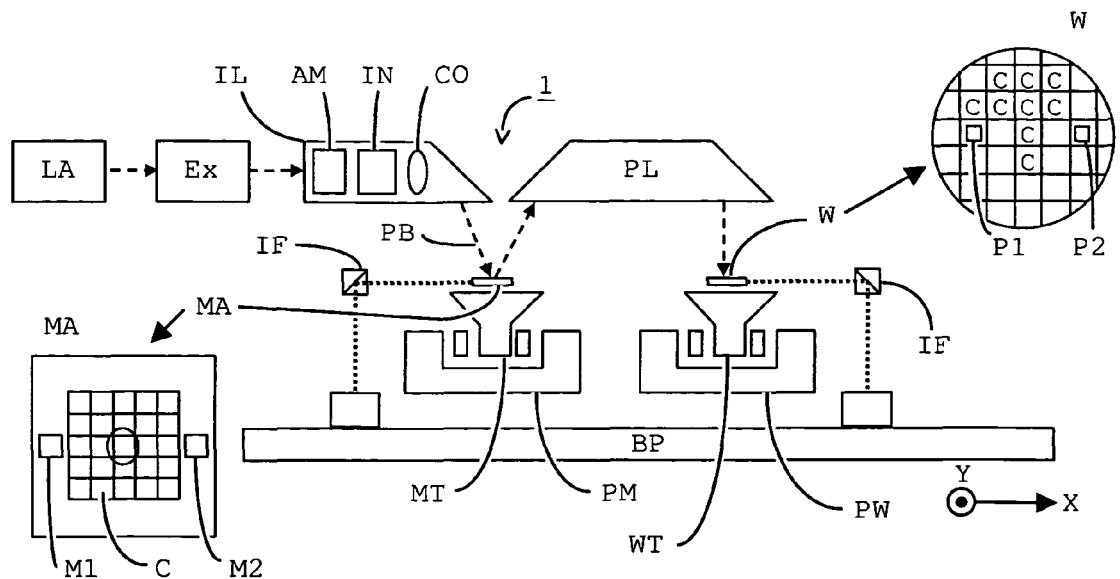
FIG. 1 depicts a lithographic apparatus according to an embodiment of the invention.

FIG. 1 schematically depicts a lithographic projection apparatus 1 according to an embodiment of the invention. The apparatus includes a radiation system Ex, IL, configured to supply a beam PB of radiation (e.g. UV radiation). In this particular case, the radiation system also includes a radiation source LA. The apparatus also includes a first object table (mask table) MT provided with a mask holder configured to hold a mask MA (e.g. a reticle), and connected to a first positioning device PM configured to accurately position the mask with respect to the projection system ("lens"), item PL. The apparatus further includes a second object table (substrate table) WT provided with a substrate holder configured to hold a substrate W (e.g. a resist-coated silicon wafer), and connected to a second positioning device PW configured to accurately position the substrate with respect to the projection system ("lens"), item PL, the projection system ("lens") PL being configured to image an irradiated portion of the mask MA onto a target portion C (e.g. including one or more dies) of the substrate W.

As here depicted, the apparatus is of a transmissive type (i.e. has a transmissive mask). However, in general, it may also be of a reflective type, for example (with a reflective mask). Alternatively, the apparatus may employ another kind of patterning device, such as a programmable mirror array of a type as referred to above.

The source LA produces a beam of radiation. This beam is fed into an illumination system (illuminator) EL, either directly or after having traversed a conditioning device, such as a beam expander Ex, for example. The illuminator IL may include an adjusting device AM configured to set the outer and/or inner radial extent (commonly referred to as σ-outer and σ-inner, respectively) of the intensity distribution in the beam. In addition, it will generally include various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable directing mirrors); this latter scenario is often the case when the source LA is an excimer laser. The current invention and claims encompass both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning device PW (and interferometric measuring device IF), the substrate table WT can be moved accurately, e.g. so as to position different target portions C in the path of the beam PB. Similarly, the first positioning device PM can be used to accurately position the mask MA with respect to the path of the beam PB, e.g. after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 1. However, in the case of a wafer stepper (as opposed to a step-and-scan apparatus) the mask table MT may just be connected to a short stroke actuator, or may be fixed. Mask MA and substrate W may be aligned using mask alignment marks M1, M2 and substrate alignment marks P1, P2.

The depicted apparatus can be used in different modes:

1. In step mode, the mask table MT is kept essentially stationary, and an entire mask image is projected at once (i.e. a single "flash") onto a target portion C. The substrate table WT is then shifted in the x and/or y directions so that a different target portion C can be irradiated by the beam PB; and 2. In scan mode, essentially the same scenario applies, except that a given target portion C is not exposed in a single "flash". Instead, the mask table MT is movable in a given direction (the so-called "scan direction", e.g. the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

3. In another mode, the mask table MT is kept essentially stationary holding a programmable patterning device, and the substrate table WT is moved or scanned while a pattern imparted to the beam of radiation is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Figure 2A:
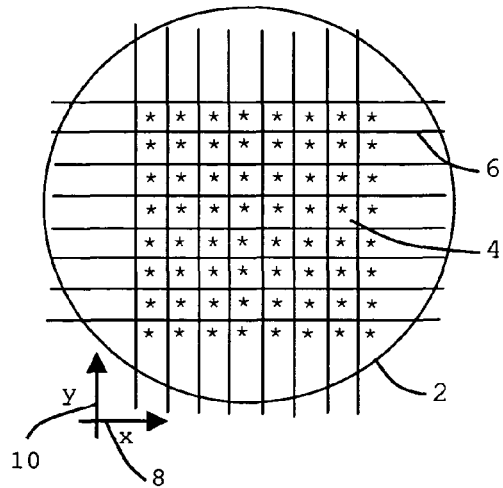
FIGS. 2A and 2B illustrate a substrate with a wafer pattern.
Figure 2B:
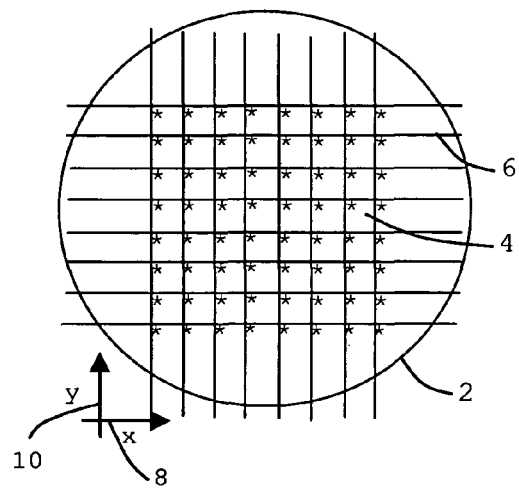

FIGS. 2A and 2B illustrate a substrate 2 including a rectangular, orthogonal recurrence grid 6 of target portions 4. The substantially circular substrate 2 may be rotated over any angle without influencing the recurrence grid 6 of target portions 4. Therefore, the orientation of the substrate 2 as such is unimportant in this case.

Corresponding to the recurrence grid 6, two axes of a pattern coordinate system are illustrated. A first axis is the x-axis 8 and a second the y-axis 10. As the recurrence grid 6 in FIG. 2A and the recurrence grid 6 in FIG. 2B are the same, the pattern coordinate systems in FIGS. 2A and 2B are the same.

Every target portion 4 on one substrate 2 is substantially the same in this embodiment, i.e. they have at least corresponding features. The structure of target portion 4 may not be known to a lithographic apparatus projecting the target portions 4 and may have any arbitrary geometry. However, the recurrence grid 6, i.e. the formation of the target portions 4, is known to the apparatus as it needs to step (or scan) through the recurrence grid 6 to project each target portion 4. Therefore, after projection, the lithographic apparatus cannot distinguish between the substrate 2 of FIG. 2A having a '*' in the center of the target portion 4 and the substrate 2 of FIG. 2B having a '*' in the upper-left corner of the target portion 4, since the formation of the target portions is identical. Further, the recurrence grid 6 is translated in relation to the '*' and thus the lithographic apparatus is not able to determine a position of the recurrence grid 6 from any two structures having corresponding features, but a rotation may be determined as will be described hereinafter.

Figure 3:
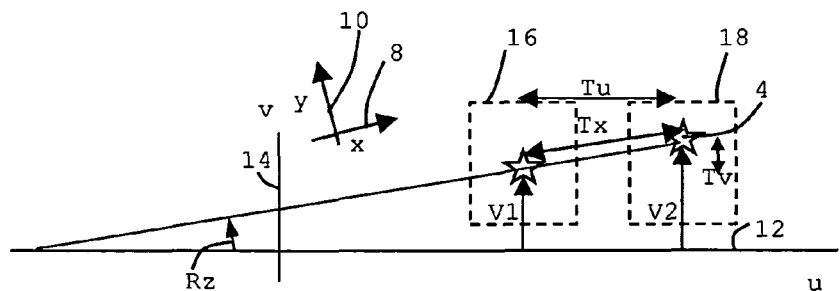
FIG. 3 is a graph illustrating a principle of a rotation determination according to an embodiment of the present invention.

FIG. 3 shows two target portions 4 (represented by '*') which lie on one substrate. A straight line through the centers of the target portions 4 lies parallel to the x-axis 8 of a pattern coordinate system and is perpendicular to the y-axis 10 thereof. Thus, an orientation of the pattern coordinate system is associated with the orientation of the target portions and substrate. A measurement coordinate system has a u-axis 12 and a v-axis 14, which axes are orthogonal. The measurement coordinate system is associated with the illumination system of the lithographic apparatus and thus with an orientation of a structure to be projected by the illumination system.

For alignment purposes, for example, the rotation of the pattern coordinate system in relation to the measurement coordinate system should be known. A rotation angle Rz may be defined as the angle between the u-axis 12 and the x-axis 8. In this example illustrating two orthogonal coordinate systems, the rotation angle Rz may be calculated using basic goniometry. However, also in cases of other coordinate systems, the rotation angle Rz may be calculated.

In FIG. 3, the distance Tx between the target portions 4 along the x-axis 8 is known to the lithographic projection apparatus. The measurement system selects two detection positions as if the target portions 4 lie parallel to the u-axis 12. However, in this example, the substrate is rotated over an angle Rz and therefore a line through the target portions 4 does not lie parallel to the u-axis 12. Thus, acquiring two images 16 and 18 to detect the position of the target portions 4 parallel to the u-axis 12 provides images wherein the target portions are displaced in relation to the images. However, the measurement system may not know what structure may be present in the images and is therefore unable to determine a displacement in relation to the images. Since the images would be identical with respect to the corresponding features of the structures, a displacement between the structures may be derived from the two images by comparing the corresponding features present in the images. Using this displacement, a rotation of the line through the structures and the u-axis 12 may be determined.

After acquiring two separate images or acquiring one image and cutting sub-images therefrom, the measurement system compares the two images 16 and 18 and finds a translation Tv in the direction of the v-axis 14 (v2-v1). Using basic goniometry, the inverse sinus of the translation Tv in the direction of the v-axis 14 divided by the distance Tx provides the rotation angle Rz. The distance Tx is known by the lithographic apparatus for stepping or scanning through the recurrence grid, as the distance Tx is the distance between the target portions 4 in the recurrence grid.

In addition, from the two acquired images 16 and 18, the distance Tu along the u-axis 12 may be determined. Using Tu and Tv, the inverse tangent of translation Tv divided by the distance Tu may also provide the rotation angle Rz. Also determining other distances and using other calculations may provide the rotation angle Rz.

Figure 4A:
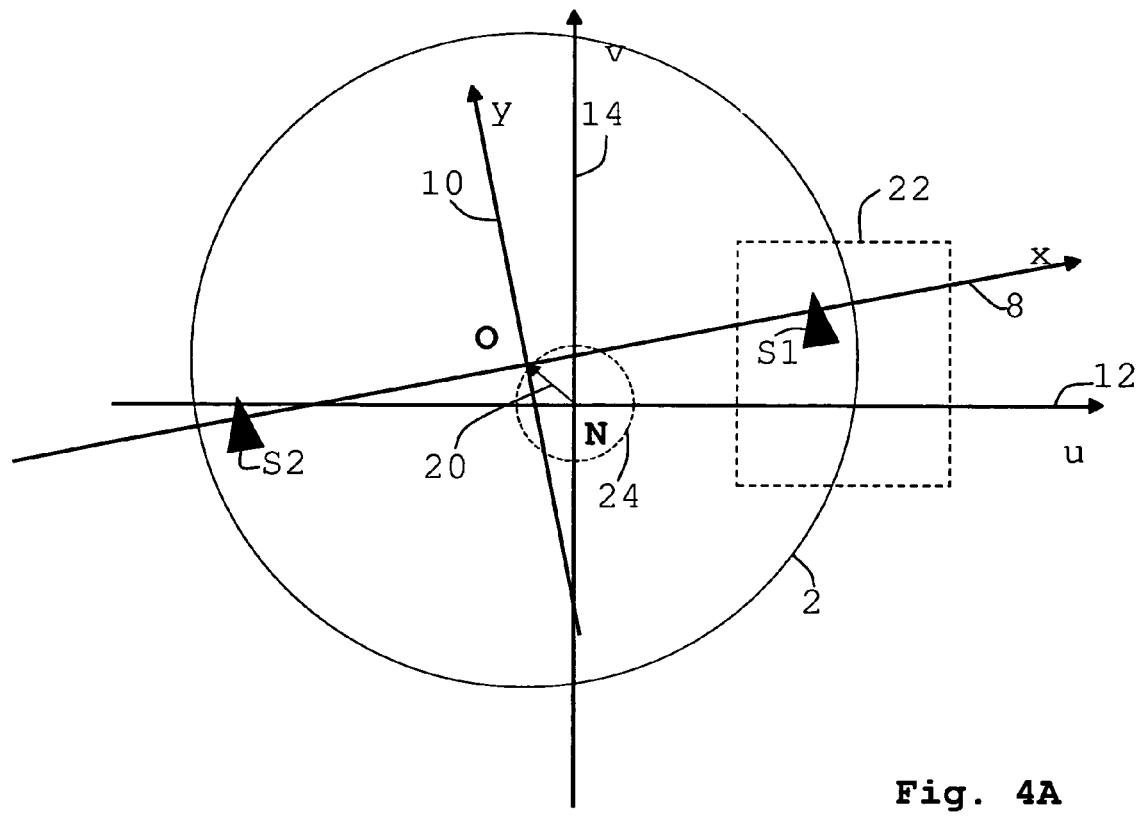
FIGS. 4A-4E are schematic drawings illustrating a method for acquiring two images from a pattern by rotating a substrate relative to an imaging device and determining a rotation of the pattern therefrom according to an embodiment of the present invention.
Figure 4B:
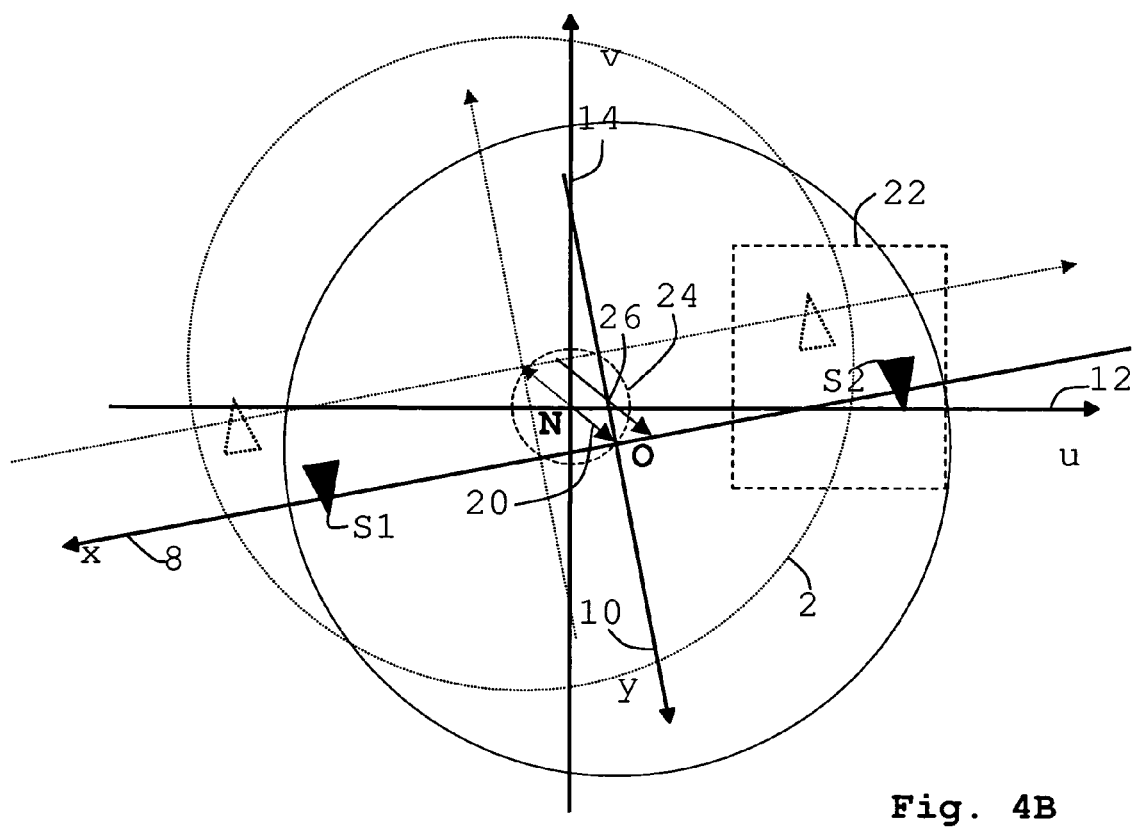

FIGS. 4A and 4B illustrate a method, according to an embodiment of the invention, wherein an imaging device may be moveable along a radial direction of a rotatable pad and a substrate on the rotatable pad may be rotated relative to the imaging device such that the imaging device may acquire an image of each of at least two structures having corresponding features. Such an assembly of a rotatable pad and an imaging device moveable along a radial direction may be present in existing lithographic apparatus. Therefore, it is advantageous to use this assembly to obtain images of structures. However, as will be shown hereinafter, it may complicate the derivation of the distance vector between the structures.

The position of the pattern coordinate system may not be known. Therefore it may be unknown around which point the pattern coordinate system is rotated, when the rotatable pad rotates. By selecting a center of the rotatable pad as an origin of the measurement coordinate system, the origin of the measurement coordinate system is defined as the center of rotation. Since the pattern coordinate system may be translated in relation to the measurement coordinate system, a rotation results in an unknown relative displacement of the second structure when the second structure is imaged, in relation to the position of the first structure. Further, when imaged, the second structure will be rotated in relation to the first structure, as will be explained below.

FIG. 4A shows a pattern coordinate system having origin O, x-axis 8 and y-axis 10, and a measurement coordinate system having origin N, u-axis 12 and v-axis 14. The origin of the pattern coordinate system O is chosen to lie in the center of substrate 2. The pattern coordinate system is translated and rotated in relation to the measurement coordinate system. The translation is indicated by translation vector 20 between the origins O and N. Two identical structures S1 and S2 lying on the x-axis 8 are indicated by a triangle with a top upwards. Further, an image frame 22 illustrates which region is imaged by an imaging device.

FIG. 4B illustrates the two coordinate systems described in FIG. 4A. The pattern coordinate system however has been rotated around the origin N of the measurement coordinate system over 180 degrees, indicated by rotation vector 24. With dashed lines, the substrate and the pattern coordinate system at their position of FIG. 4A is indicated. From FIG. 4B, it will be appreciated that the pattern coordinate system has not only been rotated but also has been translated in relation to the pattern coordinate system of FIG. 4A due to the rotation around origin N. A rotation translation vector 26 has a length twice the length of the translation vector 20 as can be seen in FIG. 4B. Since the translation vector 20 is unknown, there is an uncertainty where structure S2 will appear after rotation of the substrate 2 around the origin N. To determine a rotation, the rotation translation vector 26 should be derived from the two images.

Further, structure S2 has been rotated as can be seen in FIG. 4B since the top of the triangle points downwards. In order to compare the corresponding features of structures S1 and S2, it is desirable that their orientation be the same. To compensate for the rotation, the second image, i.e. the image of structure S2, is rotated around a center of the image over the same angle as the rotation of the substrate 2 around the origin N earlier, but in the opposite direction.

To calculate a rotation of the pattern coordinate system in relation to the measurement coordinate system, the translation vector 20 or the rotation translation vector 26 should be determined, as stated above. How these vectors 20 and 26 are derived, will be explained with reference to FIGS. 4C and 4D.

Figure 4C:
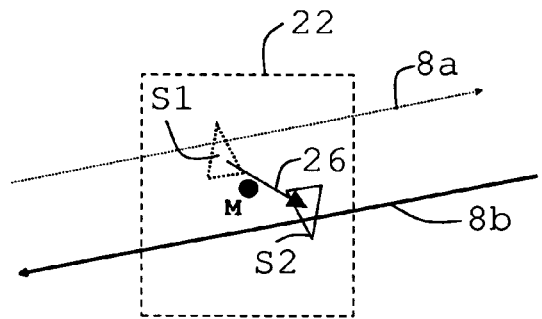

FIG. 4C shows image frame 22 wherein structure S1 with x-axis 8a is indicated with dashed lines at its position according to FIG. 4A before rotation. Structure S2 and x-axis 8b are also indicated and the rotation translation vector 26 runs from structure S1 to structure S2. A center of the image frame 22 is indicated as image origin M. The position of origin M is known in relation to the measurement coordinate system and thus to the u-axis 12, v-axis 14 and origin N. Rotation translation vector 26 may be derived from this image. Note that this image is a virtual image as it is a combination of the first image and the second image acquired by the imaging device.

Figure 4D:
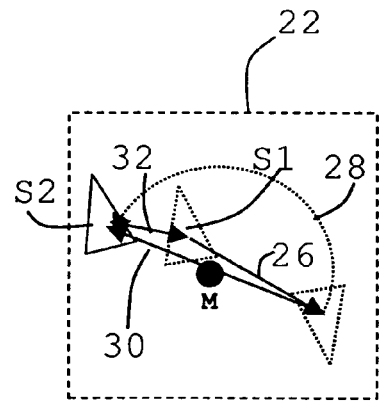

In FIG. 4D, structure S2 has been rotated around image origin M, as indicated by image rotation vector 28, which is the same as rotation vector 24, but in the opposite direction, as mentioned above. Structure S2 has been translated (image rotation translation vector 30) due to the image rotation. By comparing the first image and the rotated second image, a comparison vector 32 is determined.

The length of rotation translation vector 26 may now be calculated from image rotation translation vector 30 and comparison vector 32 by a vector sum, as will be appreciated by a person skilled in the art. Knowing the length and direction of rotation translation vector 26, the rotation of the pattern coordinate system in relation to the measurement coordinate system may be calculated.

Figure 4E:
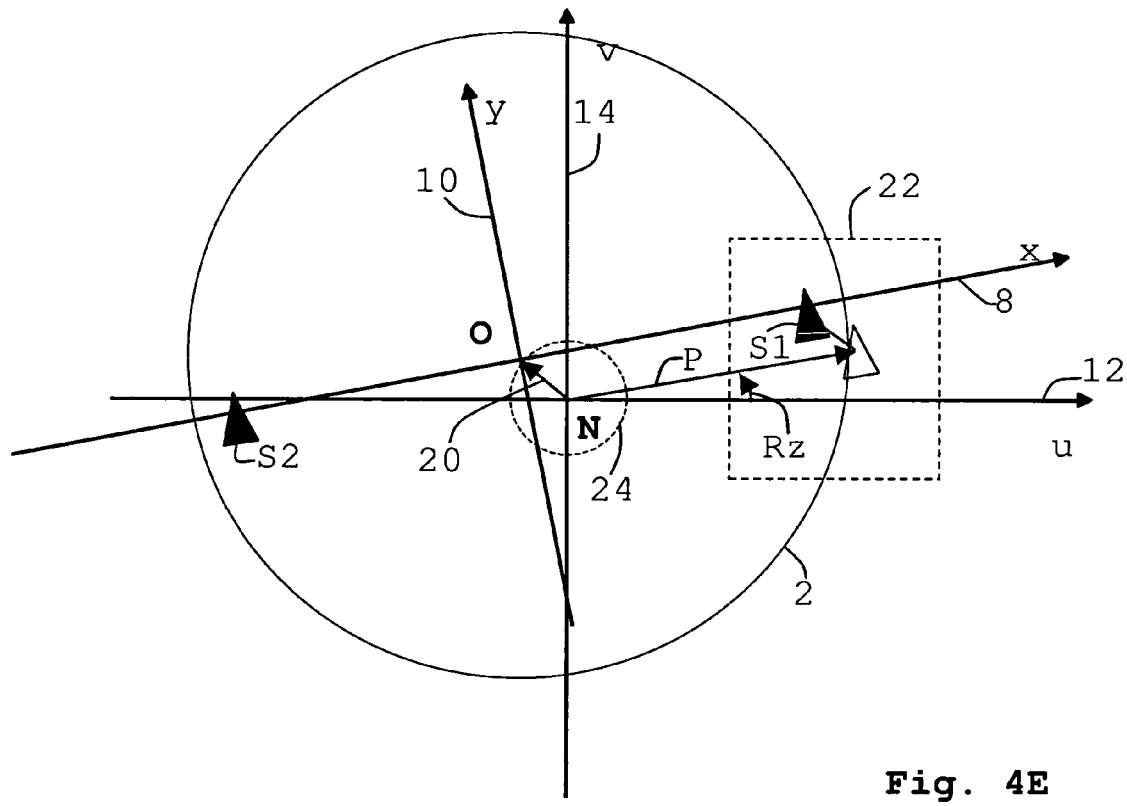

FIG. 4E is similar to FIG. 4A with one added location vector P. Location vector P points from the origin of the measurement coordinate system N to a virtual location of structure S1 in the measurement coordination system. This virtual location is determined from the actual location and the translation vector 20, which is half of the rotation translation vector 26. Structure S1 does not lie on the u-axis 12, only due to a rotation of the pattern coordinate system. Therefore, location vector P is parallel to the x-axis 8, and an angle between location vector P and u-axis 12 is the rotation angle Rz. A person skilled in the art will appreciate how this angle may be determined.

The method described above, wherein the images of the at least two identical structures are acquired separately, rotating the substrate around the origin of the measurement coordinate system and leaving the imaging device substantially stationary, may be performed using any other suitable mathematical formulae or in any other suitable order. Further, other methods to acquire more than one image, e.g. translations or rotations of the imaging device or the substrate or any combination thereof may also be employed in another embodiment of the present invention.

Figure 5:
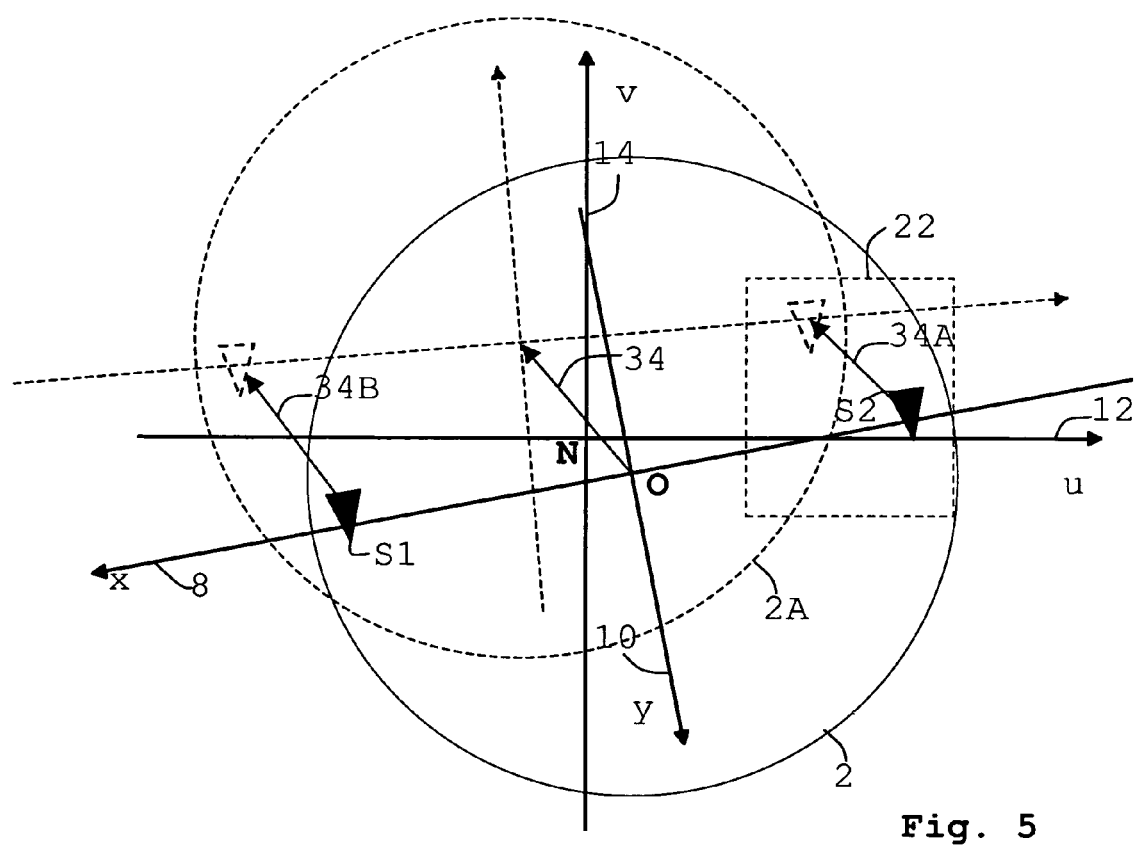
FIG. 5 is a schematic drawing illustrating a principle of a translation determination according to an embodiment of the present invention.

FIG. 5 illustrates a method to determine a position of a substrate using the positions of the structures S1, S2, according to an embodiment of the invention. Such a determination may only be performed for another substrate 2A after a rotation and translation of a first substrate 2 is determined. FIG. 5 shows a first substrate 2 and another substrate 2A. A rotation of the first substrate has been determined according to a method described in one of the above embodiments of the present invention. Further, a position measurement system has determined a translation, i.e. a position relative to the illumination system, of the first substrate 2. Another substrate 2A having the same structures S1, S2 thereon is supplied to the rotation measurement system. The position of the structures S1, S2 is determined to determine the rotation. Further, the position of the structures S1, S2 may be used to estimate the translation of the other substrate 2A.

The position of structures S1, S2 of the first substrate 2 and of the other substrate 2A is compared and two structure translation vectors 34A, 34B are determined. An average translation vector 34 may be determined from the two structure translation vectors 34A and 34B. In FIG. 5, the translation vector 34 is the average of the two structure translation vectors 34A and 34B. The translation vector 34 added to the measured position of the first substrate 2 is an estimate of the position of the other substrate 2A.

While specific embodiments of the invention have been described above, it will be appreciated that the invention may be practiced otherwise than as described. The description is not intended to limit the invention.

Further, although the method of determining a rotation of a coordinate system in relation to another coordinate system has been presented with regard to a lithographic projection apparatus, it will be appreciated that the method may be employed in other technical fields as well.

What is claimed is:

1. A device manufacturing method comprising:
    patterning a beam of radiation using a patterning device;
    determining a rotational position orientation of a substrate by:
        acquiring an image of each of at least two structures disposed on said substrate;
        determining a distance vector in a measurement coordinate system between the at least two structures disposed on said substrate by comparing the respective images of the at least two structures, said at least two structures having corresponding features and of which relative positions are known in relation to a pattern coordinate system different from the measurement coordinate system;
        decomposing the distance vector into a first distance along a first axis of the measurement coordinate system and a second distance along a second axis of the measurement coordinate system; and
        calculating a rotational position of the pattern coordinate system in relation to the measurement coordinate system using the first and the second distance; and
    aligning the substrate and the patterning device according to the rotational position orientation of the substrate; and
    projecting the patterned beam of radiation onto a target portion of a layer of radiation-sensitive material disposed on the substrate.

2. The method of claim 1, wherein the at least two structures have an arbitrary geometry.

3. The method of claim 1, wherein the distance vector is determined from at least one image of the at least two structures, the at least one image being acquired by an imaging device.

4. The method of claim 3, further comprising acquiring an image of each of the at least two structures separately.

5. The method of claim 4, further comprising rotating the substrate and displacing the imaging device essentially along a radius of the substrate to obtain a separate image of each structure.

6. The method of claim 3, wherein said determining the distance vector includes finding a maximum correlation between images of the structures.

7. The method of claim 1, wherein the pattern coordinate system is defined by a recurrence grid of a recurrent pattern.

8. The method of claim 1, wherein the at least two structures are asymmetrical.

9. The method of claim 1, further comprising determining an orientation of another substrate by calculating a translation of the pattern coordinate system in relation to the measurement coordinate system, said calculating including:
   determining a position of the first substrate using a position measurement system;
   determining a rotational position of the other substrate using same structures, having corresponding features, as the at least two structures used for determining the rotational position of the first substrate;
   determining relative structure translation vectors between the at least two structures of the first substrate and of the other substrate; and
   determining a position of the other substrate using the measured position of the first substrate as a reference position and the structure translation vectors between the structures of the first substrate and of the other substrate as a displacement from the reference position.

10. The method of claim 9, wherein the reference position is amended after each determination of the position of each other substrate by the position measurement system.

11. A method for determining a rotational position of an object within a lithographic apparatus having an illumination system, a support structure, a substrate table, and a projection system, the method comprising:
   determining a distance vector in a measurement coordinate system between two structures on the object by comparing an image of each of the structures said structures each having corresponding features and of which relative positions are known in relation to a pattern coordinate system different than the measurement coordinate system;
   decomposing the distance vector into a first distance along a first axis of the measurement coordinate system and a second distance along a second axis of the measurement coordinate system;
   calculating a rotational position of the pattern coordinate system in relation to the measurement coordinate system using the first and the second distance, and
   aligning the object in the lithographic system according to the rotational position.

12. A lithographic apparatus comprising:
   an illumination system configured to condition a beam of radiation;
   a support structure configured to support a patterning device, the patterning device serving to pattern the beam of radiation according to a desired pattern;
   a substrate table configured to hold a substrate;
   a projection system configured to project the patterned beam of radiation onto a target portion of the substrate; and
   an alignment system to align said substrate with said patterning device, wherein the alignment system must acquire an image of each of two structures disposed on said substrate, compare an image of each of the two structures to determine a distance vector in a measurement coordinate system between the two structures disposed on said substrate, said two structures having corresponding features and of which relative positions are known in relation to a pattern coordinate system different than the measurement coordinate system, decompose the distance vector into a first distance along a first axis of the measurement coordinate system and a second distance along a second axis of the measurement coordinate system, and calculate a rotational position of the pattern coordinate system in relation to the measurement coordinate system using the first and the second distance.

13. A method for aligning a substrate in a lithographic apparatus comprising:
   acquiring images of first and second corresponding structures to determine a first distance vector between the first and the second corresponding structures in a measurement coordinate system of the lithographic apparatus, the first and second corresponding structures being located on two adjacent target portions of the substrate;
   determining a second distance vector between the first and second corresponding structures in a pattern coordinate system different than the measurement coordinate system;
   determining a rotational position angle of the pattern coordinate system relative to the measurement coordinate system using the first and the second distance vector, and
   aligning the substrate in the lithographic apparatus according to the rotational position angle.

14. The method of claim 13, wherein the images of the first and second corresponding structures are acquired with a CCD-camera.

15. The method of claim 13, wherein the second distance vector corresponds to the incremental exposure step of the lithographic apparatus.

16. The method of claim 13, further comprising aligning the substrate based on the rotational position angle.

* * * * *